United States Patent [19]

Satoh

[11] Patent Number: 4,746,864
[45] Date of Patent: May 24, 1988

[54] MAGNETIC RESONANCE IMAGING SYSTEM

[75] Inventor: Kozo Satoh, Yokohama, Japan
[73] Assignee: Kabushiki Kaisha Toshiba, Kawasaki, Japan
[21] Appl. No.: 31,461
[22] Filed: Mar. 30, 1987
[30] Foreign Application Priority Data Mar. 31, 1986 [JP] Japan .................................. 61-72910

[51] Int. Cl.$^4$ ............................................ G01R 33/20
[52] U.S. Cl. ...................................... 324/309; 324/307
[58] Field of Search ............... 324/300, 307, 309, 313, 324/314, 318, 322; 128/653

[56] References Cited

U.S. PATENT DOCUMENTS 4,165,479  8/1979  Mansfield ............................ 324/309
4,625,170 11/1986  Yamamoto .......................... 324/309
4,689,567  8/1987  Maudsley ............................. 324/309

FOREIGN PATENT DOCUMENTS 57-500708  4/1982  Japan .

OTHER PUBLICATIONS

Journal of Magnetic Resonance 29, 355-373 (1978) Biological and Medical Imaging by NMR P. Mansfield and I. L. Pykett.

Primary Examiner—Michael J. Tokar
Attorney, Agent, or Firm—Oblon, Fisher, Spivak, McClelland & Maier

[57] ABSTRACT

In an MRI system of this invention, a pulsed RF magnetic field, and pulsed slice, phase encoding, and read gradient fields are applied to an object to be examined placed in a uniform static magnetic field in accordance with a predetermined sequence by a controller, thereby causing an MR phenomenon. Echo signals based on the MR phenomenon are acquired so as to obtain an image of MR data. The controller alternately and repetitively executes a first operation for applying the read gradient field while repetitively inverting it so as to produce the echo signal, and a second operation for applying, as the radio-frequency magnetic field, a 180° pulse which can compensate for an echo signal phase error due to a nonuniformity and offset of the static magnetic field so as to generate the echo signal. The controller also inverts the phase encoding gradient field each time the 180° pulse is applied.

5 Claims, 8 Drawing Sheets

MAGNETIC RESONANCE IMAGING SYSTEM

BACKGROUND OF THE INVENTION

The present invention relates to magnetic resonance imaging (MRI) and, more particularly, to an MRI system capable of high-speed imaging processing for obtaining an instantaneous image of a region including a dynamic object such as a heart.

As is well known, an MRI method utilizes a magnetic resonance (MR) phenomenon to two-dimensionally or three-dimensionally obtain chemical and/or physical microscopic information of a material. The MR phenomenon is a phenomenon wherein when a group of nuclear spins, which are unique to the types of atomic nuclei and have magnetic moments, are placed in a uniform static magnetic field, an energy of a radio-frequency (RF) magnetic field, which rotates at a specific frequency in a plane perpendicular to a direction of the static magnetic field, is resonantly absorbed.

In the MRI, the spatial distribution of specific atomic nuclei in an object to be examined (typically, hydrogen atomic nuclei in water or fat in a body when an object is a living body such as a human body or an animal) is imaged.

As known MRI methods, the projection reconstruction method by Lauterbur, the Fourier method by Kumar, Welti, and Ernst, the spin warp method by Hutchison et al. as a modification of the Fourier method, the echo planar method by Mansfield, and so on, have been proposed.

In an MRI system, in order to acquire data necessary for reconstructing an image, various magnetic fields are combined as needed, and are applied to an object to be examined in accordance with a predetermined sequence. In this case, data acquisition must be performed such that predetermined magnetic field application sequences are repeated while changing the intensity and-/or application time of a gradient field in a specific direction of the magnetic fields applied to the object. Therefore, a data acquisition operation, i.e., a scan operation, for long periods is necessary. For this reason, it is not easy to obtain an instantaneous image of a region including a dynamic object, such as a heart, whose position and/or shape changes over time. When such an image is obtained, an image blurring and/or artifact inevitably occurs as long as a special method such as a cardiac cycle synchronization method is not adopted. In the cardiac cycle synchronization method, data acquisition is performed for short periods in synchronism with the movement of a dynamic portion at timings at which the dynamic portion is in the same state. In the cardiac cycle synchronization method, data acquisition is intermittently performed for short periods with relatively long rest periods. For this reason, an imaging time required for obtaining all the necessary data is prolonged. The method, such as the cardiac cycle synchronization method, for acquiring data in synchronism with the movement of the object has limited objects to be applied or to be observed, and cannot be applied to diagnosis of the heart function by time-serially observing the movement of the heart.

As methods for solving the above problem, high-speed imaging methods such as the echo planar method or the fast Fourier (FF) method have been proposed. In these methods, it was demonstrated that an MR image of the internal organs of a human body could be obtained in a short time, e.g., in about 50 msec.

The high-speed imaging methods include the FID (free induction decay) method for observing an FID signal and the spin echo method for observing a spin echo signal. The FID method and the spin echo method have different ways to excite the MR phenomenon. In this case, the spin echo method will be described below.

FIGS. 1A to 1E show pulse sequences of the spin echo method in the conventional echo planar method and the FF method.

Figure 1A:
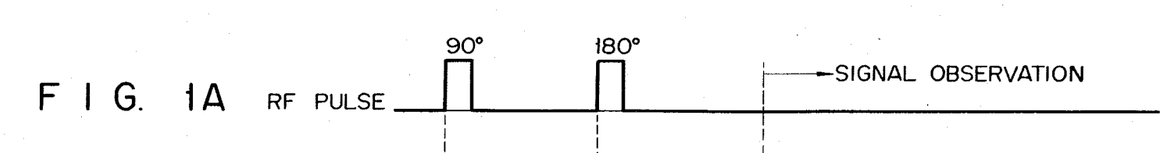
FIGS. 1A to 1E are timing charts for explaining pulse sequences in imaging of the conventional echo planar method and the FF method.
Figure 1B:
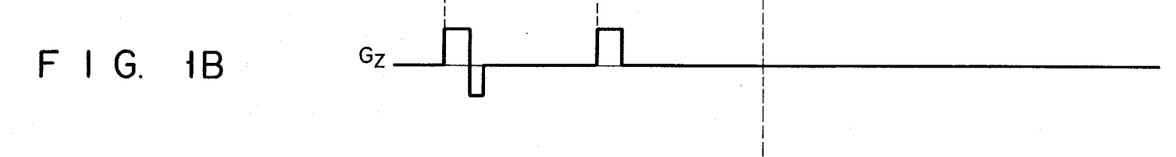

In the echo planar method, gradient field Gz in a z direction for selecting a slice to be imaged is applied (FIG. 1B), and a 90° pulse (an excitation pulse, whose flip angle of the magnetization vector caused by excitation is 90°, is called a 90° pulse) is applied while gradient field Gz is applied (FIG. 1A). After application of the 90° pulse, gradient field Gz is inverted (FIG. 1B). After application of inverted gradient field Gz, gradient field Gy in a y direction (perpendicular to the z direction) is applied for a predetermined period of time (FIG. 1D). Thereafter, gradient field Gz is applied (FIG. 1B), and a 180° pulse (an excitation pulse with which a magnetization vector of a nuclear spin is inclined through 180° as a result of excitation) is applied while gradient field Gz is applied (FIG. 1A). After a predetermined period of time has passed from the application of the 180° pulse, gradient field Gx in an x direction (perpendicular to magnetic fields in the y and z directions) is applied (FIG. 1C), and gradient field Gy is applied to be superimposed on gradient field Gx (FIG. 1D). Gradient field Gx is repetitively inverted at predetermined timings while gradient field Gy is applied (FIG. 1C).

Figure 1C:
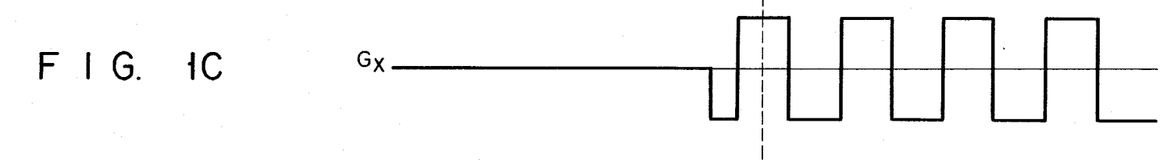
Figure 1D:
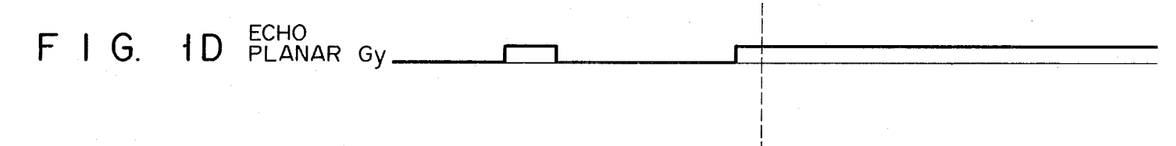
Figure 1E:
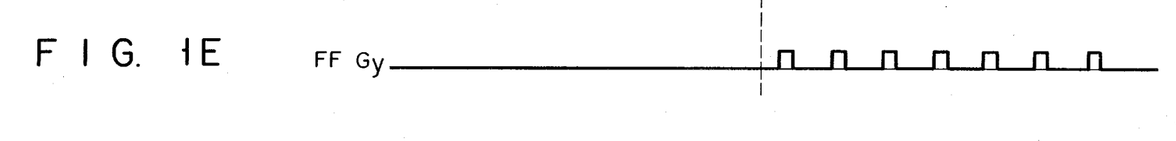
Figures 2A, 2B:
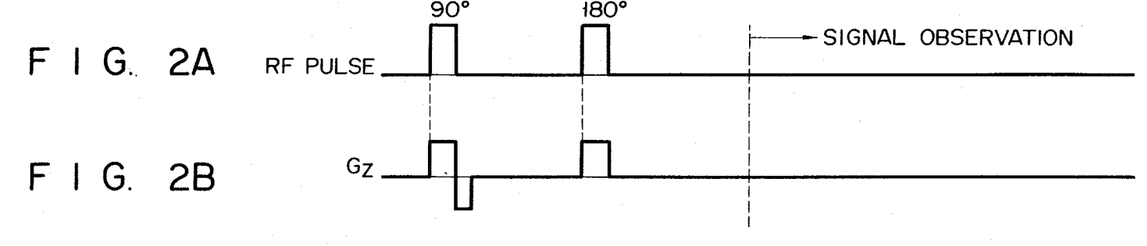
FIGS. 2A to 2F are timing charts for explaining pulse sequences in imaging of the conventional rapid projection method and the spiral scanning method.
Figure 2C:
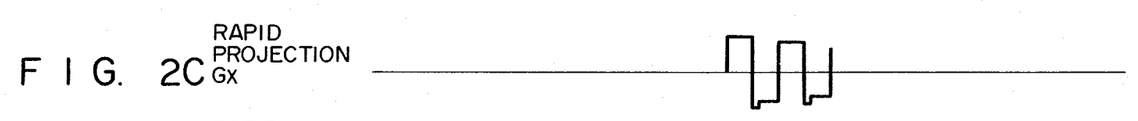
Figures 2D, 2E:
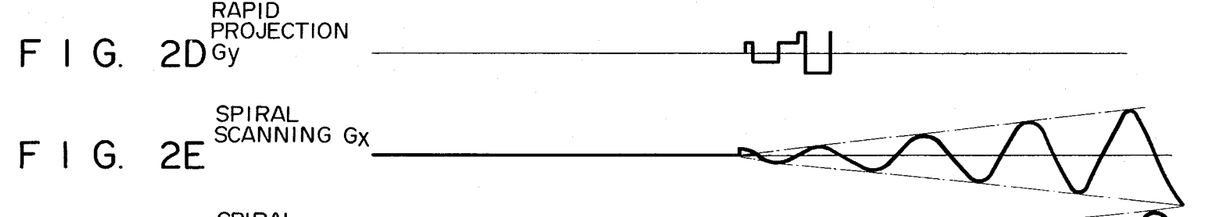
Figure 2F:
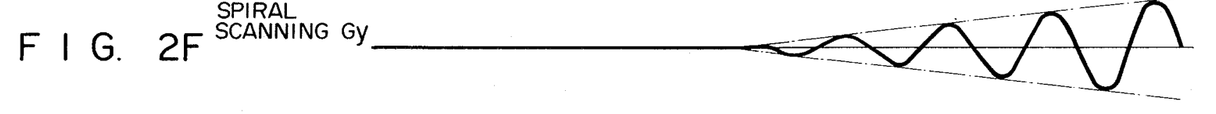

In the FF method, the excitation pulses and gradient fields Gz and Gx are applied in the same manner as in the echo planar method, as shown in FIGS. 1A to 1C. However, gradient field Gy is applied differently from the echo planar method, as shown in FIG. 1E. In this method, pulsed gradient field Gy is applied upon second inversion and thereafter of gradient field Gx.

The conventional high-speed imaging methods include the rapid projection method and the spiral scanning method in addition to the above-mentioned echo planar method and the FF method. FIGS. 2A to 2D show the pulse sequences of the rapid projection method in the spin echo method, and FIGS. 2A, 2B, 2E, and 2F show the pulse sequences of the spiral scanning method.

In the conventional high-speed imaging methods, the gradient field must be repetitively inverted at high speed, so as to generate spin echoes a predetermined number of times determined by an image matrix. For example, if a matrix size of an image is (2N×2N), (N+1) echo signals must be acquired. Therefore, if N=32, 33 echo signals must be acquired. In this case, the gradient field must be repetitively inverted at a very high speed in consideration of nonuniformity of the gradient field or offset from resonant point. In addition, since the gradient field must have a very high intensity (i.e., the degree of gradient), this may cause an adverse influence on an object to be examined if the object is a living body.

When nonuniformity $\Delta H(x,y)$ of the static field is present (assuming the case wherein an object is sliced along a plane perpendicular to the z direction), a transversal magnetization vector of point (x,y) is subjected to phase modulation at an angular velocity of $\gamma\Delta H(x,y)$. Therefore, a phase error of the transversal magnetization is accumulated proportional to an elapsed time from application of the RF pulse for exciting the MR phenomenon. For example, phase error $\phi n$ of the nth echo signal is given by $\phi n = \gamma \Delta H(x,y) nTI$ (TI is a time interval between inversions of the gradient field). Assuming that the nonuniformity of the static magnetic field is $|\Delta H(x,y)|$ max/H0 (H0 is the central static magnetic field intensity) and the intensity of the static magnetic field is 0.5T, $|\gamma \Delta H(x,y)|$ max is about 40 $\pi$. In this case, if the phase error is to be suppressed to $\pi/10$, NTI $\approx$ 2.5 msec, and if N=32, TI=80 $\mu$sec. In this case, the inversion of the gradient field must be completed within a time of about 10 $\mu$sec. However, it is impossible to invert the gradient field in such a short period of time for the purpose of safety of an object (patient) and in terms of technique. This also applies to a case wherein the inversion of the gradient field is performed in accordance with a moderate waveform such as a sine wave, like in the spiral scanning method.

The gradient intensity when the gradient field is inverted according to a rectangular wave will be evaluated. If a one-dimensional length (diameter) of an object portion to be imaged is 20 cm, and an image matrix is (64×64), spatial resolution $\Delta l$ of 3 mm can be obtained. Since a frequency resolution in observation time TI=80 $\mu$sec is $\Delta f = 1/TI = 12.5$ kHz, the gradient field is $G = \Delta f / \Delta l = 42$ kHz/cm. This value is about 5 times the maximum gradient intensity of 8 kHz/cm used in the conventional system for a human body, and may cause an adverse influence on the human body. In addition, this value is difficult to attain in terms of the present technique. Assuming that inversion time $\Delta TI$ of the gradient field (a time required for completing inversion) is 10 $\mu$sec, a changing ratio of the gradient field is $G' = 2G/\Delta T \approx 10^{10}$ Hz/cm-sec, and this may cause an adverse influence on the human body. If static magnetic field intensity H0 is decreased, the abovementioned requirements for the inversion time and intensity of the gradient field are moderated since $\Delta H(x,y) \propto H0$. However, if H0=0.1T, this value is still difficult to attain.

A signal to be observed is given by the spatial integral associated with x and y of magnetization present at point (x,y). For this reason, if the phase error is accumulated due to the influence of the nonuniformity of the magnetic field, as described above, a complicated distortion from correct Fourier data occurs. Since this distortion is not simple, the influence of the nonuniformity of the magnetic field cannot be removed by computational processing of a known algorithm for the Fourier method and the projection method. The influence of the nonuniformity of the magnetic field in the high-speed imaging not only causes a mere spatial distortion of an image, but also causes blurring and a noticeable artifact of an image.

In this manner, since it is difficult to compensate for the influence of the nonuniformity of the magnetic field by software processing, it is required to reduce the nonuniformity itself. However, it is technically difficult to reduce $\Delta H(x,y)$ to a negligible level. As the magnetic field intensity is increased, $\Delta H(x,y)$ increases proportionally thereto. Therefore, the abovementioned difficulty is still enhanced.

For these reasons, the conventional high-speed imaging methods can only realize to reconstruct a relatively small object in a low magnetic field of about 0.1T. An image having an artifact can only be obtained by imaging under these conditions. If the low magnetic field is used, an S/N (signal-to-noise) ratio is further degraded in addition to poor S/N ratio as the nature of high-speed imaging, and the image quality is considerably degraded. For these reasons, although high-speed imaging has excellent features, it cannot be applied to actual clinical examination.

In order to eliminate an influence of the nonuniformity of the magnetic field and offset of the magnetic field intensity from the resonance point and to allow an algorithm for compensating for an image distortion caused by the nonuniformity of the magnetic field to be applied, it can be considered that an echo signal operation by applying a 180° pulse is used instead of that by repetitively applying the gradient field in the conventional high-speed imaging. More specifically, an operation for applying a 180° pulse a plurality of number of times to produce a multiple echo signal and an operation for applying predetermined magnetic fields are combined based on the CPMG (Carr Purcell Meiboom Gill) method or the modified CP (Carr Purcell) method known in the NMR spectroscopy, and entire image reconstruction data is acquired by single excitation using the 90° pulse. In this case, 180° pulse application is performed so as not to accumulate the phase error of the echo signal.

However, in the CPMG method and the modified CP method, a very large number of 180° pulses must be applied. For this reason, if an object is a human body, the above methods may adversely influence the human body. The 180° pulses used can include selective excitation pulses for exciting only magnetization in a specific slice plane and nonselective excitation pulses for exciting the entire predetermined imaging region. When the selective excitation pulses are used, a necessary power can be reduced as compared to the case of the nonselective excitation pulses, and multi-slice imaging (for time sharing imaging a plurality of different slices during an imaging time for a single slice utilizing a magnetization recovery period of time) can be allowed. However, as the number of echoes of a multiple echo signal string is increased caused by problems associated with the apparatus arrangement, a slice characteristic is degraded, and an echo signal level is decreased upon degradation. As a result, this causes a hazard to the human body, and an image quality of a resultant MR image is degraded. When the nonselective excitation pulses are used, this may cause a serious hazard to the human body. In this case, multi-slice imaging cannot be performed. In addition, flip angles of magnetization caused by excitation pulses may be shifted, and a pseudo FID signal as an FID signal which would not be produced after the 180° pulse may be produced due to the nonuniformity of the 180° pulses. Therefore, an artifact may be formed on an MR image due to mixture of the pseudo FID signal.

In this manner, the conventional high-speed imaging methods may cause image blurring due to the nonuniformity of the static magnetic field, generation of artifacts, and degradation in S/N ratio, at a practical static field intensity. In the CPMG method or the modified CP method which can eliminate the influence of the nonuniformity of the static magnetic field, this may cause a serious hazard to an object to be examined.

SUMMARY OF THE INVENTION

The present invention has been made to solve the above problems in the conventional methods, and has as its object to provide an MRI system which can suppress degradation in image quality caused by the nonuniformity of a static magnetic field, can allow high-speed imaging that can obtain an instantaneous image of a dynamic object such as the heart, and can reduce an adverse influence on an object to be examined to a negligible level.

In order to achieve the above object, in the MRI system of the present invention, an RF magnetic field, and slice, phase encoding, and read gradient fields are pulsatively applied to an object to be examined placed in a uniform static magnetic field in accordance with a predetermined sequence by a controller, and echo signals based on the excited MR phenomenon are acquired to obtain an MR image. The controller alternately executes a first operation for applying the read gradient field while repetitively inverting it so as to generate the echo signals, and a second operation for applying, as the RF magnetic field, 180° pulses for compensating for a phase error of the echo signals due to the nonuniformity and offset of the static magnetic field so as to produce the echo signals. The controller also inverts the phase encoding gradient field for each application of 180° pulse.

In the MRI system of the present invention, the first operation for repetitively inverting the read gradient field and the second operation during which the phase errors due to the nonuniformity and offset of the static magnetic field will not be accumulated are alternately executed. Therefore, accumulation of phase errors caused by the first operation is prevented, and degradation in image quality due to the accumulation of the phase errors is eliminated.

Since the phase encoding gradient field is inverted for each application of 180° pulse, data at positions symmetrical about a read axis on the Fourier space can be alternately obtained for image reconstruction data. Therefore, when echo signal generation operations are performed for a number of times corresponding to those performed by applying the read gradient field while repetitively inverting it are performed, all the Fourier data necessary for image reconstruction can be obtained by utilizing the symmetry of Fourier data. The number of application times of 180° pulses in the second operation can be greatly reduced as compared to a case wherein necessary data is obtained by only the echo signal generation operation utilizing a 180° pulse application. Therefore, an adverse influence on the object (mainly, heat up due to RF pulses) can be greatly eliminated.

According to the MRI system of the present invention, degradation in image quality, such as image blurring, distortion, artifacts caused by the nonuniformity of a static magnetic field can be prevented, and high-speed imaging that can obtain an instantaneous image of a dynamic object such as a heart can be performed. In addition, with this system, an object to be examined will not be exposed to the danger of an RF magnetic field.

DETAILED DESCRIPTION OF THE PREFERRED EMBODIMENTS

Figure 3:
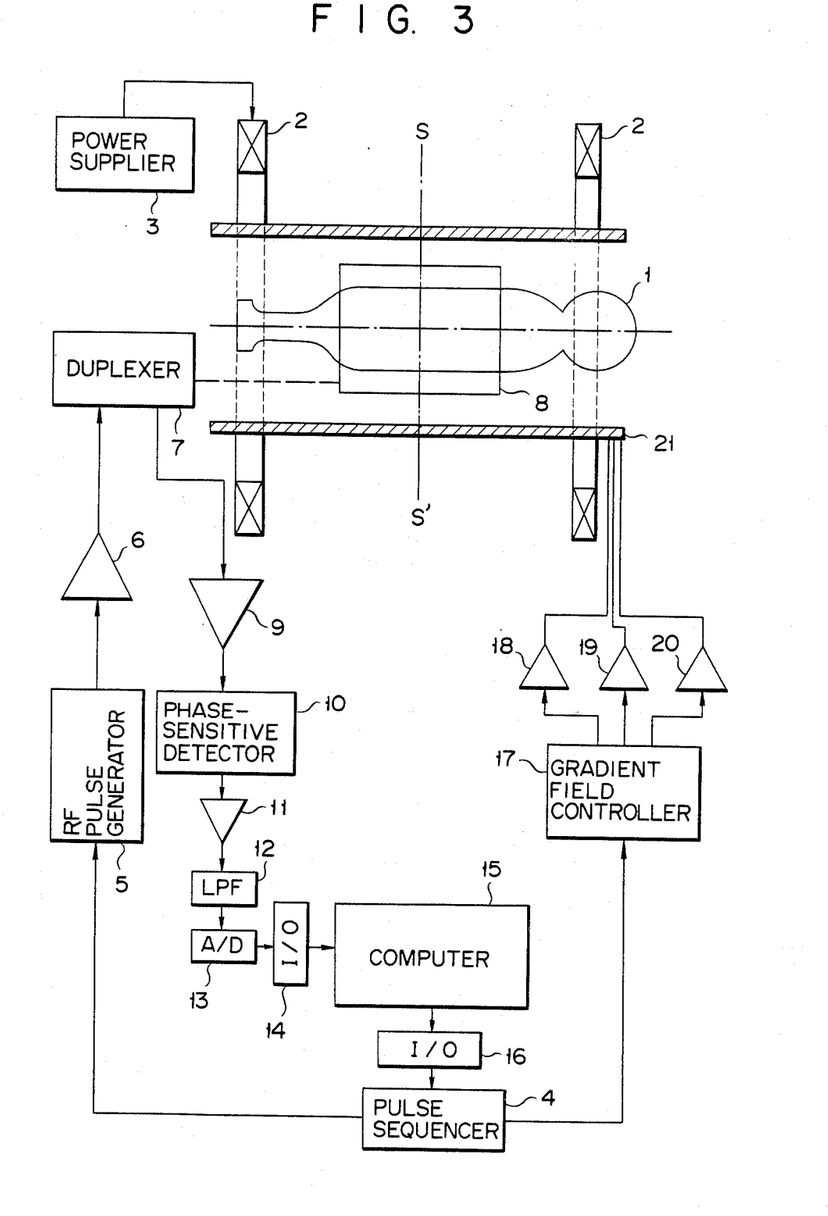
FIG. 3 is a block diagram showing the arrangement of an MRI system according to a first embodiment of the present invention.

FIG. 3 is a block diagram showing the arrangement of the MRI system according to a first embodiment of the present invention.

The MRI system comprises static magnetic field generation coils 2, excitation power supplier 3, pulse sequencer 4, RF pulse generator 5, amplifiers 6, 9, 11, 18, 19, and 20, duplexer 7, transmission/reception coil 8, phase-sensitive detector 10, low-pass filter 12, A/D converter 13, interfaces 14 and 16, computer 15, gradient field controller 17, and gradient field generation coil 21.

Static magnetic field generation coils 2 are excited by power supply from excitation power supplier 3 and generate a uniform static magnetic field in an imaging region of object to be examined (living subject) 1. RF pulse generator 5 which is controlled by pulse sequencer 4 generates an RF pulse signal which is at a predetermined frequency and has a predetermined envelope. As the predetermined envelope, a rectangular wave, Gaussian waveform, or a sinc waveform is normally used. The waveform of the RF pulse signal is obtained by amplitude-modulating the signal at the predetermined frequency by the signal having the predetermined envelope. The RF pulse signal is amplified to a predetermined level by RF amplifier 6, and thereafter, is supplied to coil 8 through duplexer 7. The RF pulse signal is applied from duplexer 7 to coil 8, thereby forming an RF magnetic field or rotating magnetic field. Thus, the RF magnetic field excites the MR phenomenon in living body 1. Transversal magnetization caused in living body 1 by the MR phenomenon excited by the RF magnetic field is detected by coil 8, and an MR signal induced by the transversal magnetization is output across the two ends of coil 8. In this system, transmission/reception coil 8 is commonly used as both a transmission coil for generating the RF magnetic field and a reception coil for receiving the MR signal.

The MR signal induced in coil 8 is input to RF amplifier 9 through duplexer 7, and is amplified to a predetermined level. The MR signal amplified by amplifier 9 is detected by phase-sensitive detector 10, and is converted to a video-band signal. Detector 10 is a circuit for detecting a signal component synchronous with a predetermined reference signal from an input signal like in a synchronous detector. Detector 10 can be replaced with a quadrature detector including a combination of two phase-sensitive detectors. An output signal from detector 10 is voltage-amplified by video amplifier 11, and is filtered by low-pass filter 12 to remove a high-frequency noise component therefrom. An output signal from low-pass filter 12 is converted to MR data as a digital signal by A/D converter 13, and thereafter, is fetched by computer 15 through interface 14. Computer 15 accumulates the fetched MR data as image reconstruction data. Computer 15 controls pulse sequencer 4 through interface 16.

Determination of a position of a slice to be imaged, phase encoding (i.e., conversion of position information in a slice plane of living body 1 into phase information of an MR signal), and the like are performed by applying the gradient field to living body 1 and/or adjusting the gradient field. For this purpose, upon excitation of the MR phenomenon in living body 1 and MR signal acquisition, pulsed gradient fields in a plurality of directions are switched at predetermined timings and in orders, and are applied. The switching timing of the gradient fields is controlled by pulse sequencer 4.

The intensity and pulse shape of the gradient field are controlled by gradient field controller 17 responsive to pulse sequencer 4. More specifically, power amplifiers 18, 19, and 20 corresponding to the gradient fields in the x, y, and z directions are controlled by gradient field controller 17, and gradient field generation coil 21 is driven by power amplifiers 18, 19, and 20. When coil 21 is driven, a gradient field having a predetermined intensity and/or a change over time is generated near an imaging region of living body 1.

FIGS. 4A to 4D are the timing charts showing the pulse sequences for high-speed imaging in the system of this embodiment. The pulse sequences are controlled by pulse sequencer 4.

In order to selectively excite nuclear spins in a slice of interest in the living body, a 90° selective excitation pulse in an x' direction in the rotating coordinate system is applied as the RF magnetic field while gradient field Gz for selecting a slice position is applied to an imaging region together with the static magnetic field. The 90° selective excitation pulse causes a magnetization vector of a nuclear spin in the selected slice to selectively incline through 90°, so that the magnetization vector is oriented in a y' direction in the rotating coordinate system. In this case, a direction perpendicular to the slice plane is given as a z direction, and a coordinate system having x and y axes on the plane to which the slice plane belongs is assumed. After the application of the 90° selective excitation pulse, slice gradient field Gz is inverted, and phases of spins dispersed in the z direction are converged in the y' direction. Gradient field Gy in the y direction as a phase encoding gradient field is applied for time Ty. A 180° pulse oriented in the y' direction in the rotating coordinate system is applied after time $\tau$ has passed from the mean time of 90° selective excitation pulse application. Spins of phases $$\gamma Gy \cdot y \cdot Ty + \gamma(\Delta H(x,y,z) + \delta H0)\tau$$

are mirror-image inverted about the y' axis. More specifically, $\phi$ is inverted to $-\phi$.

In this case, upon MR signal detection, quadrature detection is performed so that the y' axis corresponds to the real axis and the x' axis corresponds to the imaginary axis.

Phase encoding gradient field Gy is then applied, and gradient field Gx as a read gradient field is inverted a plurality of times and applied while gradient field Gy is applied, thereby acquiring MR signals (echo signals).

At this time, a timing at which read gradient field Gx is applied is determined so that an echo signal generation time instance estimated from 180° pulse application coincides with an echo signal generation time instance by application of gradient field Gx. In FIGS. 4A to 4D, read gradient field Gx is repetitively inverted five times to be applied six times, and 5 echo signals are generated.

Phase dispersion due to $\Delta H$ and $\delta H0$ is extinguished at a peak position of an echo signal produced by 180° pulse application. When echo signals are acquired during interval A–B in FIGS. 4A to 4D after application of the first 180° pulse, data can be obtained along an oblique zigzag line, as shown in FIG. 5. FIG. 5 shows a data scanning trajectory on the Fourier space when the pulse sequences shown in FIGS. 4A to 4D are used, and data points corresponding to A to D and ①, ②, ... in FIGS. 4A to 4D are denoted by the same symbols or numbers.

If a time instance of a peak of an echo signal by the 180° pulse is t=0, a signal at time t is proportional to the following equation:

$$\int \rho(x,y) e^{i\gamma\phi(x,y,t)} dx dy$$

where $$\phi(x,y,t) = \gamma[\Delta H(x,y) + \delta H0 + Gy\, y]t + x \int_{-\tau}^{\tau} Gx(t) dt$$

A phase error due to $\Delta H(x,y)$ and $\delta H0$ is increased in proportion to time. In order to compensate for this, after echo signals are acquired during interval A–B, a second 180° pulse oriented in the y' direction as that of the first 180° pulse is applied. Phase encoding gradient field Gy is then applied, and while gradient field Gy is applied, read gradient field Gx is repetitively inverted a plurality of times (eight times in FIG. 5) and is applied nine times, so that pseudo echo signal appears for each time Te (echo interval).

Upon application of the second 180° pulse, a data point on the Fourier space jumps from point B to point C which is point-symmetrical with point B about origin O. In this case, the polarity of phase encoding gradient field Gy is inverted, and gradient field Gy having the opposite polarity to that of gradient field Gy which was applied last (before application of the second 180° pulse, i.e., between applications of first and second 180° pulses), is applied. In this way, data can be obtained along a zigzag line extending from point C to D, as shown in FIG. 5.

At an instance when a peak of an echo signal is expected to appear upon application of the 180° pulse, a phase error due to $\Delta H(x,y)$ and $\delta H0$ can be compensated for. If a timing is shifted from this instance, the phase error is increased proportional to this shift. In terms of this respect, after application of the second 180° pulse, read gradient field Gx is repetitively inverted and applied nine times, thereby producing eight echo signals, in FIG. 5.

When echo signal acquisition during interval C - D is completed, a third 180° pulse oriented in the same y' direction as that of the first and second pulses is applied, and the same process as in application of the second 180° pulse is performed. The same operation is repeated until a predetermined number of echo signals necessary for obtaining all the Fourier data are obtained.

If the matrix size of an image to be reconstructed is (2N×2N), When (N+1) echo signals are acquired by utilizing the point symmetry of Fourier data, i.e., the relation $S(-kx,-ky)=S^*(kx,ky)$ (* represents a complex conjugate), all the Fourier data can be obtained. More specifically, data at a point indicated by Δ in FIG. 5 can be determined using data at a point symmetrical therewith. Fourier data on the orthogonal coordinate system is obtained from Fourier data on the zigzag line in FIG. 5 by interpolation, and is two-dimensionally Fourier transformed, thereby obtaining spin density distribution $\rho(x,y)$ in a given slice.

For example, assuming an image matrix of (64×64), 33 echo signals are necessary. In this case, for example, if number N' of echo signals acquired after application of the first 180° pulse is 3 to 4, and the number of echo signals acquired each time a new 180° pulse is applied is 2N'+1, the number of application times of 180° pulse can be 5 times. This value is about 1/6 that (33 times) in the conventional CPMG method or the modified CP method for acquiring echo signals generated only by applying 180° pulses. Therefore, an influence on an object (living body) can be suppressed to a negligible level.

During the data acquisition process, the number of times of inversion of phase encoding gradient field Gy performed between two 180° pulses must be set so that an accumulated phase error due to the nonuniformity and offset of the static magnetic field falls in a negligible range. An interval of 180° pulse can be set 1/5 to 1/10 attenuation time constant T2* of the FID signal due to the nonuniformity of the static magnetic field.

The intensities of gradient fields Gx and Gy and inversion interval ΔT of Gx can be determined from an image matrix size (2N×2N) and maximum one-dimensional length L of an object to be imaged. Spatial resolution Δl is given as $\Delta l = 2\pi/\gamma Gx\Delta T = L/2N$ and Gx=2NGy. From these relations, the product of Gx and ΔT can be obtained, but their individual values cannot be determined. However, if total echo signal acquisition time (total scanning time) T is determined from other conditions (e.g., a time (e.g., 50 msec) during which it can be considered that the heart is apparently stopped, in the case of the heart), this can yield ΔT=T/N, and ΔT and Gx can be determined therefrom.

Figure 4A:
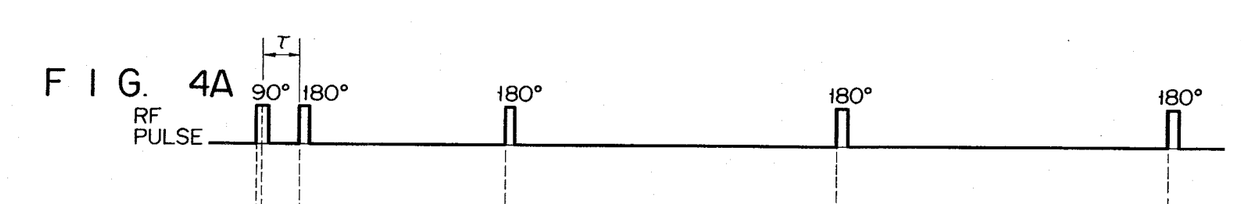
FIGS. 4A to 4D are timing charts for explaining pulse sequences for MR signal acquisition in the MRI system according to the first embodiment of the present invention.
Figure 4B:
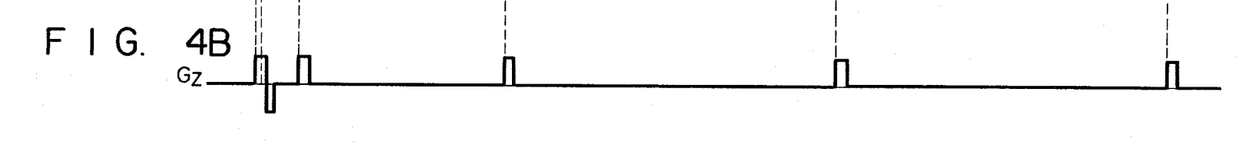
Figure 4C:
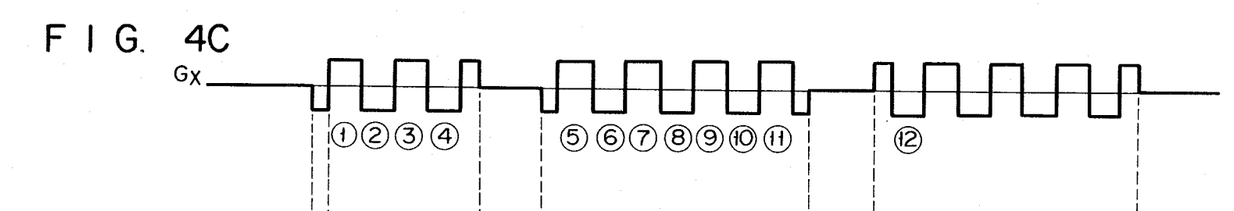
Figure 4D:
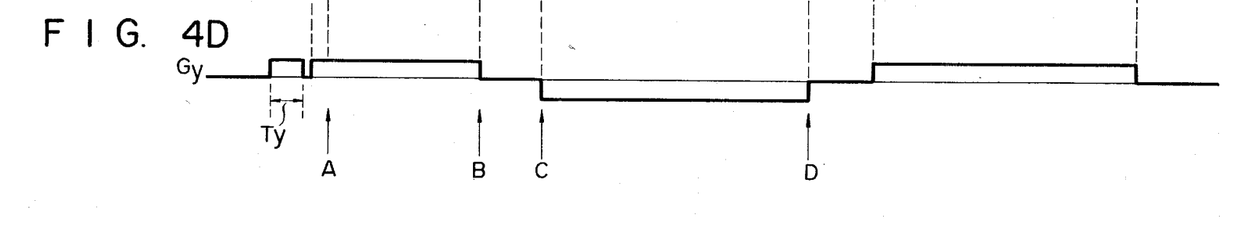
Figure 5:
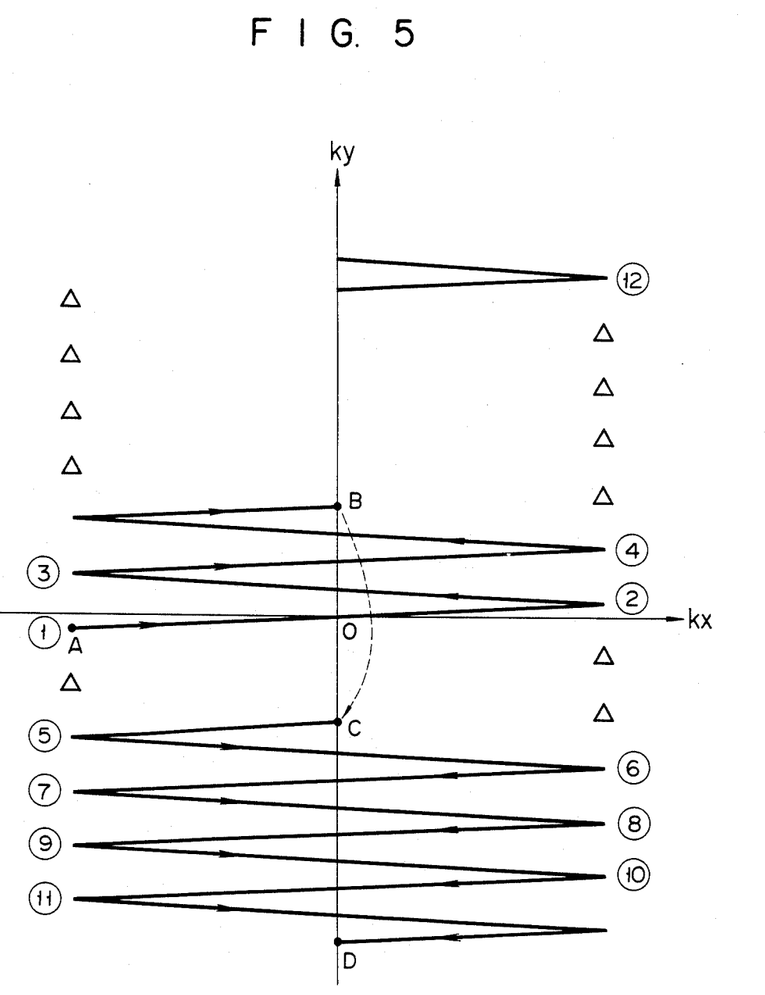
FIG. 5 is a view showing data scanning trajectory on the Fourier space corresponding to the pulse sequences shown in FIGS. 4A to 4D.
Figure 6A:
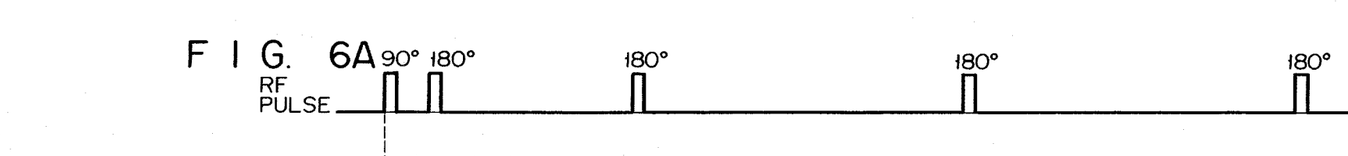
FIGS. 6A to 6D are timing charts for explaining pulse sequences for MR signal acquisition in an MRI system according to a second embodiment of the present invention.
Figure 6B:
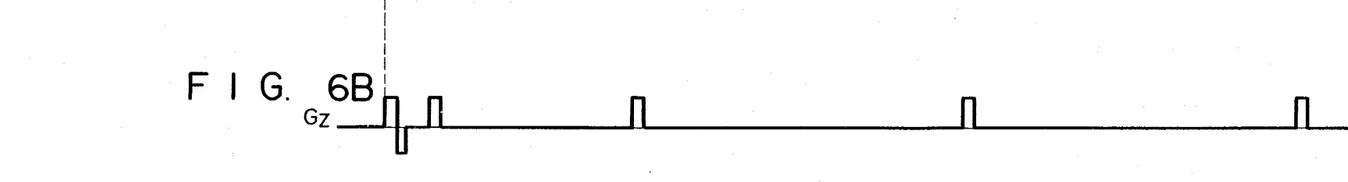
Figure 6C:
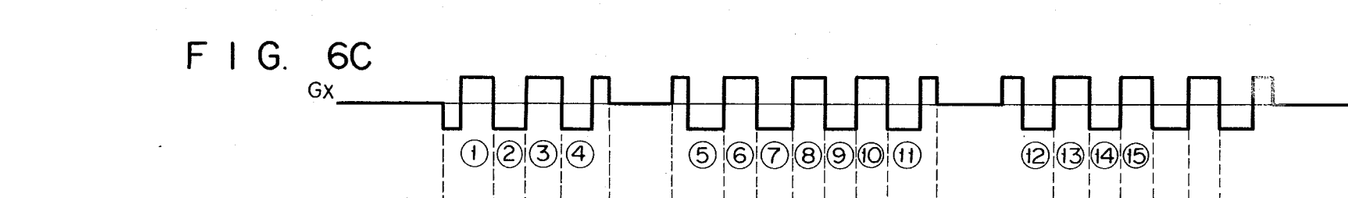
Figure 6D:
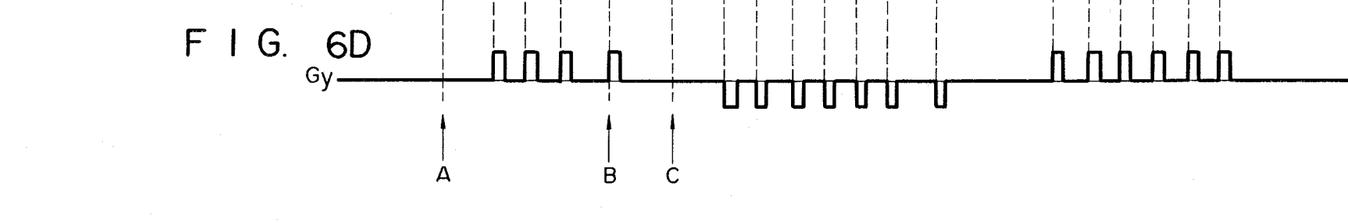

In FIGS. 4C and 4D, read gradient field Gx is repetitively inverted and applied in the same manner as in the operation of the gradient field in the echo planar method in association with read and phase encoding gradient fields Gx and Gy, and encoding gradient field Gy is applied so as not to be changed during observation. However, the same gradient field operation as in the FF method can be performed. This is a second embodiment of the present invention.

More specifically, as shown in FIGS. 6A to 6D, pulsed phase encoding gradient field Gx is applied while repetitively inverting and applying read gradient field Gx, and echo signals are observed while Gy=0, thereby acquiring Fourier data on the orthogonal grid points on the Fourier space.

Figure 7:
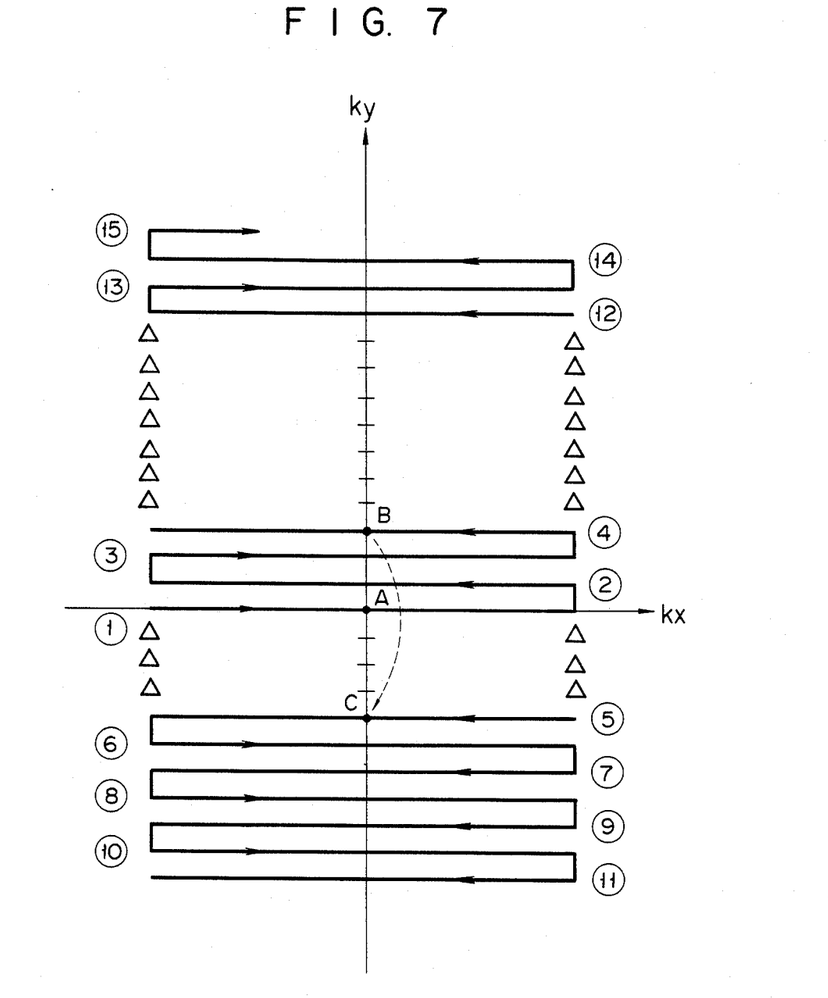
FIG. 7 is a view showing data scanning trajectory on the Fourier space corresponding to the pulse sequences shown in FIGS. 6A to 6D.

FIG. 7 shows the data scanning trajectory on the Fourier space when the pulse sequences shown in FIGS. 6A to 6D are used, and data points in FIG. 7 are denoted by the same symbols or numerals as in FIGS. 6A to 6D in correspondence with positions of A to C and 1, 2, . . . Data at point Δ is determined using data at a position point-symmetrical therewith in the same manner as described above.

The gradient field operation used in the rapid projection method or the spiral scanning method can be used.

Figure 8:
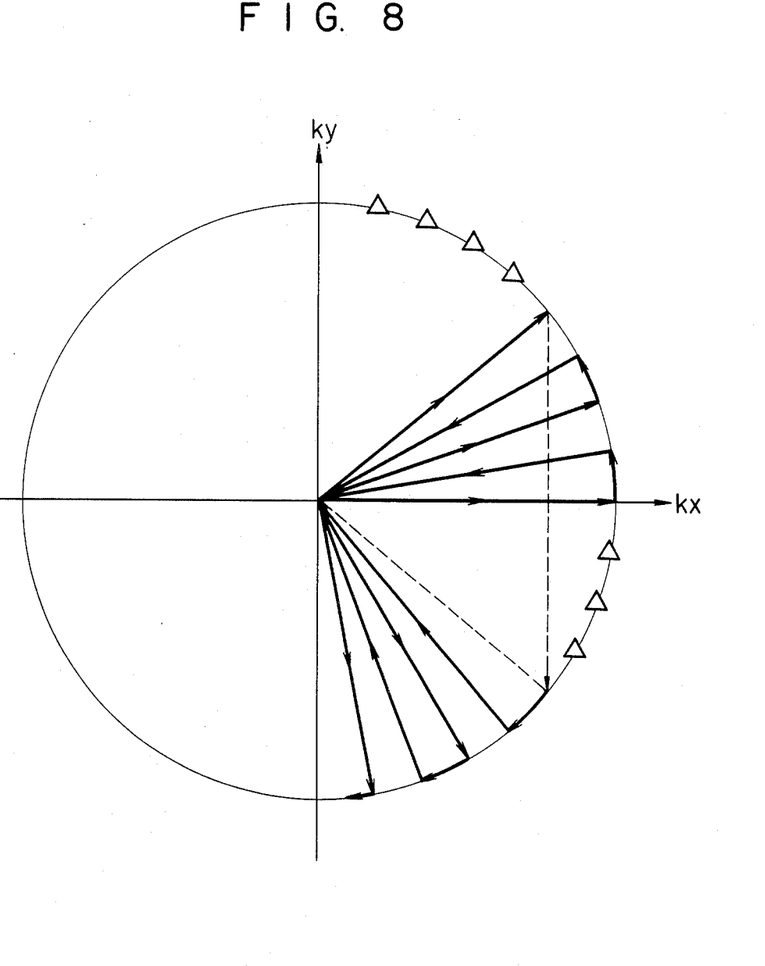
FIG. 8 is a view showing data scanning trajectory on the Fourier space corresponding to pulse sequences for MR signal acquisition in an MRI system according to a third embodiment of the present invention.

FIG. 8 shows the data scanning trajectory on the Fourier space in a third embodiment of the present invention, wherein the high-speed imaging method of the present invention is applied to the rapid projection method.

When high-speed imaging of the present invention is applied to the spiral scanning method, the sequence when spin echos are acquired by the spiral scanning method can be combined with the repetitive application operation of 180° pulse and the inversion operation of phase encoding gradient field.

In the above embodiment, all the 180° pulses are applied in the y' direction in the rotating coordinate system, in the same manner as in the CPMG method. However, the 180° pulses can be alternately applied in the x' and −x' directions in the rotating coordinate system as in the modified CP method. Both the CPMG method and the modified CP method are methods for applying 180° pulses without accompanying generation (accumulation) of phase error due to an influence of the nonuniformity of the static magnetic field, and hence, they are effective when they are combined with a method for applying a read gradient field while repetitively inverting it.

Various other changes and modifications may be made within the spirit and scope of the invention.

What is claimed is:

1. A magnetic resonance imaging system comprising: static magnetic field application means for applying a uniform static magnetic field to an object to be examined; excitation means for applying a radio-frequency magnetic field for exciting a magnetic resonance phenomenon to said object to be examined; gradient field application means for applying, to said object to be examined, a first gradient field which has a magnetic gradient along a first direction and is used for determining a slice to be imaged in which the magnetic resonance phenomenon is excited, a second gradient field which has a magnetic gradient along a second direction perpendicular to the first direction and is used for phase-encoding echo data based on the magnetic resonance phenomenon, and a third gradient field which has a magnetic gradient along a third direction perpendicular to the first and second directions, and is used for reading out the echo data based on the magnetic resonance phenomenon; control means for controlling said excitation means and said gradient field application means so as to apply the pulsed radio-frequency magnetic field and the pulsed first to third gradient fields in accordance with a predetermined sequence; signal acquisition means for acquiring an echo signal based on the magnetic resonance phenomenon generated in the object to be examined; and image reconstruction means for obtaining an image of magnetic resonance data from the echo signal, said control means comprising     first echo control means for alternately and repetitively executing a first operation for applying the third gradient field while repetitively inverting it so as to produce the echo signal, and a second operation for applying, as the radio-frequency magnetic field, a 180° pulse which can compensate for an echo signal phase error due to a nonuniformity and offset of the static magnetic field so as to generate the echo signal, and second echo control means for inverting the second gradient field each time the 180° pulse is applied.

2. A system according to claim 1, wherein said second echo control means includes means for continuously applying the second gradient field while the third gradient field is repetitively inverted in the first operation.

3. A system according to claim 1, wherein said second echo control means includes means for applying the pulsed second gradient field when the third gradient field is inverted for the second time or thereafter in the first operation.

4. A system according to claim 1, wherein said control means includes means for applying the second and third gradient fields in accordance with an application format of the rapid projection method.

5. A system according to claim 1, wherein said control means includes means for applying the second and third gradient fields in accordance with an application format of the spiral scanning method.

* * * * *